(12) United States Patent
Wilcoxon et al.

(10) Patent No.: US 11,942,738 B2
(45) Date of Patent: Mar. 26, 2024

(54) ASSEMBLY FOR CHASSIS ELECTRICAL AND MECHANICAL RIGHT-ANGLE CONNECTION

(71) Applicant: Rockwell Collins, Inc., Cedar Rapids, IA (US)

(72) Inventors: Ross K. Wilcoxon, Cedar Rapids, IA (US); Russell C. Tawney, Cedar Rapids, IA (US); Reginald D. Bean, Center Point, IA (US); Peter M. Sahayda, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 143 days.

(21) Appl. No.: 17/146,882

(22) Filed: Jan. 12, 2021

(65) Prior Publication Data

US 2022/0224065 A1 Jul. 14, 2022

(51) Int. Cl.
*H01R 31/02* (2006.01)
*H01R 33/92* (2006.01)

(52) U.S. Cl.
CPC .............. *H01R 33/92* (2013.01); *H01R 31/02* (2013.01)

(58) Field of Classification Search
None
See application file for complete search history.

(56) References Cited

U.S. PATENT DOCUMENTS

| | | | | |
|---|---|---|---|---|
| 4,988,306 A | * | 1/1991 | Hopfer, III | ......... H01R 13/2407 439/74 |
| 6,102,709 A | * | 8/2000 | Howard | ............ H01R 13/6474 333/260 |

(Continued)

FOREIGN PATENT DOCUMENTS

| | | |
|---|---|---|
| CN | 201013219 | 1/2008 |
| CN | 101128092 A | 2/2008 |
| CN | 105427942 A | 3/2016 |
| CN | 109994255 A | 7/2019 |
| DE | 10237084 A1 | 2/2004 |
| DE | 102013101801 A1 | 8/2014 |

(Continued)

OTHER PUBLICATIONS

European Extended Search Report in 22151191.8 dated Jun. 7, 2022, 10 pages.

*Primary Examiner* — Felix O Figueroa
(74) *Attorney, Agent, or Firm* — Suiter Swantz pc llo

(57) ABSTRACT

A structural connector system for providing an electrical connection between electronic componentry is disclosed. The structural connector system includes a structural member, including an electrically insulating matrix, an electrically conducting path, a first end surface, a second end surface, and a first component engaging surface. The first component engaging surface includes a first mechanical coupler configured to mechanically couple a first electronic component or a first chassis component to the structural member and a first electrical coupler configured to electrically couple the first electronic component or the first chassis component to a first end of the electrically conducting path. The structural member further includes a second component engaging surface that includes a second mechanical coupler and a second electrical coupler configured to electrically couple the first electronic component, the first chassis component, the second electronic component, or the second chassis component to a second end of the electrically conducting path.

7 Claims, 6 Drawing Sheets

(56) References Cited

U.S. PATENT DOCUMENTS

| | | | |
|---|---|---|---|
| 6,435,905 B1 * | 8/2002 | Yu | H01R 12/7029 |
| | | | 439/567 |
| 7,294,007 B1 | 11/2007 | Awlyes | |
| 7,811,094 B2 * | 10/2010 | Kuwahara | H01R 13/2407 |
| | | | 439/67 |
| 7,964,792 B2 | 6/2011 | Edel | |
| 9,837,738 B2 | 12/2017 | Jackson et al. | |
| 2002/0066388 A1 | 6/2002 | Taylor et al. | |
| 2004/0062597 A1 | 4/2004 | Gilliland et al. | |
| 2006/0084318 A1 * | 4/2006 | Si | H01R 12/716 |
| | | | 439/564 |
| 2014/0334084 A1 | 11/2014 | Fricker | |
| 2015/0289388 A1 | 10/2015 | Conway et al. | |
| 2016/0380584 A1 | 12/2016 | DeGraaff | |
| 2018/0249600 A1 | 8/2018 | Coppola | |
| 2019/0029132 A1 | 1/2019 | Haba et al. | |

FOREIGN PATENT DOCUMENTS

| | | |
|---|---|---|
| ES | 1067144 U | 4/2008 |
| KR | 101548233 B1 | 8/2015 |
| WO | 2008153811 A3 | 2/2009 |

* cited by examiner

ASSEMBLY FOR CHASSIS ELECTRICAL AND MECHANICAL RIGHT-ANGLE CONNECTION

BACKGROUND

There is growing interest in integrating electronic functions into a smaller three-dimensional space. One space-saving technique is the attachment of electronic components to structural elements in an assembly. Typically, when electronic components are directly attached to structural elements in an assembly, the electronic components themselves are electrically connected to each other with cables, flexible circuits, rigid-flex circuit boards, etc. These types of connections can consume substantial system volume, be costly, and introduce additional challenges in system assembly, as the cables and their connectors may interfere with module- and chassis-level assembly operations, and because the electrical connections must be made while the system is partially assembled and remain connected while mechanical components are assembled together. Therefore, it would be advantageous to provide a solution that cures the shortcomings described above.

SUMMARY

A structural connector system for providing an electrical connection between electronic componentry is disclosed. In one or more embodiments, the structural connector system includes a first structural member. In one or more embodiments, the first structural member includes an electrically insulating matrix. In one or more embodiments, the first structural member includes an electrically conducting path. In one or more embodiments, the first structural member includes a first end surface. In one or more embodiments, the first structural member includes a second end surface. In one or more embodiments, the first structural member includes a first component engaging surface. In some embodiments, the first component engaging surface includes a first mechanical coupler configured to mechanically couple a first electronic component or a first chassis component to the structural member. In some embodiments, the first component engaging surface includes a first electrical coupler configured to electrically couple the first electronic component or the first chassis component to a first end of the electrically conducting path. In some embodiments, the first structural member includes a second component engaging surface. In some embodiments, the second component engaging surface includes a second mechanical coupler configured to mechanically couple the first electronic component, the first chassis component, a second electronic component, or a second chassis component to the first structural member. In some embodiments, the second component engaging surface includes a second electrical coupler configured to electrically couple the first electronic component, the first chassis component, the second electronic component, or the second chassis component to a second end of the electrically conducting path.

In some embodiments of the structural connector system, the first component engaging surface and the second component engaging surface are adjacent.

In some embodiments of the structural connector system, the first component engaging surface and the second component engaging surface are not adjacent.

In some embodiments of the structural connector system, at least one of the first chassis component or the second chassis component is configured as a second structural member.

In some embodiments of the structural connector system, the first electrical coupler includes a first conducting element configured to protrude outward from the first component engaging surface and angled relative to the first component engaging surface.

In some embodiments of the structural connector system, at least one of the first end surface or the second end surface is configured as the second component engaging surface.

In some embodiments of the structural connector system, at least one of the first mechanical coupler or the second mechanical coupler includes a fastener.

In some embodiments of the structural connector system, at least one of the first mechanical coupler or the second mechanical coupler comprises a threaded bore for receiving the fastener In some embodiments of the structural connector system, the fastener is electrically isolated from the circuit of the system. In some embodiments of the structural connector system, the threaded bore accepting the fastener is configured to be integrated into the electrical system.

In some embodiments of the structural connector system, the fastener is electrically integrated into the electrical circuit.

In some embodiments of the structural connector system, the first structural member further includes a third electrical coupler configured to electrically couple the first electronic component, the first chassis component, the second electronic component, the second chassis component, a third electronic component, or a third chassis component to a third end of the electrically conducting path.

In some embodiments of the structural connector system, the structural connector system includes a passive electronic element electrically coupled to the electrically conductive path.

In some embodiments of the structural connector system, the structural connector system includes an active electronic element electrically coupled to the electrically conductive path.

In some embodiments of the structural connector system, at least one of the first mechanical coupler or the second mechanical coupler is electrically coupled to the electrically conductive path and at least one of the first electronic component or the second electronic component.

In some embodiments of the structural connector system, the electrically conductive path is configured as a trace on an external surface of the first structural member.

In some embodiments of the structural connector system, the electrically conductive path is disposed within the electrically insulating matrix.

In some embodiments of the structural connector system, at least one of the first chassis component or the second chassis component is a second structural member.

A structural connector system for providing an electrical connection between electronic componentry is also disclosed. In one or more embodiments, the structural connector system includes a first structural member. In one or more embodiments, the first structural member includes an electrically insulating matrix. In one or more embodiments, the first structural member includes a shaft disposed within the first structural member having a first aperture and a second aperture, with the shaft configured to receive electrically conductive material (e.g., a fuzz button). In one or more embodiments, the first structural member includes a first end surface. In one or more embodiments, the first structural member includes a second end surface. In one or more embodiments, the first structural member includes a first component engaging surface adjacent to at least the first end surface or the second end surface. In some embodiments, the first component engaging surface includes a first mechanical coupler configured to mechanically couple a first electronic component or a first chassis component to the structural member. In some embodiments, the first component engaging surface includes a first electrical coupler configured to electrically couple the first electronic component or the first chassis component to first aperture. In some embodiments, the first structural member includes a second component engaging surface adjacent to at least the first end surface, the second end surface, or the first component engaging surface. In some embodiments, the second component engaging surface includes a second mechanical coupler configured to mechanically couple the first electronic component, the first chassis component, a second electronic component, or a second chassis component to the first structural member. In some embodiments, the second component engaging surface includes a second electrical coupler configured to electrically couple the first electronic component, the first chassis component, the second electronic component, or the second chassis component to the second aperture.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1A:
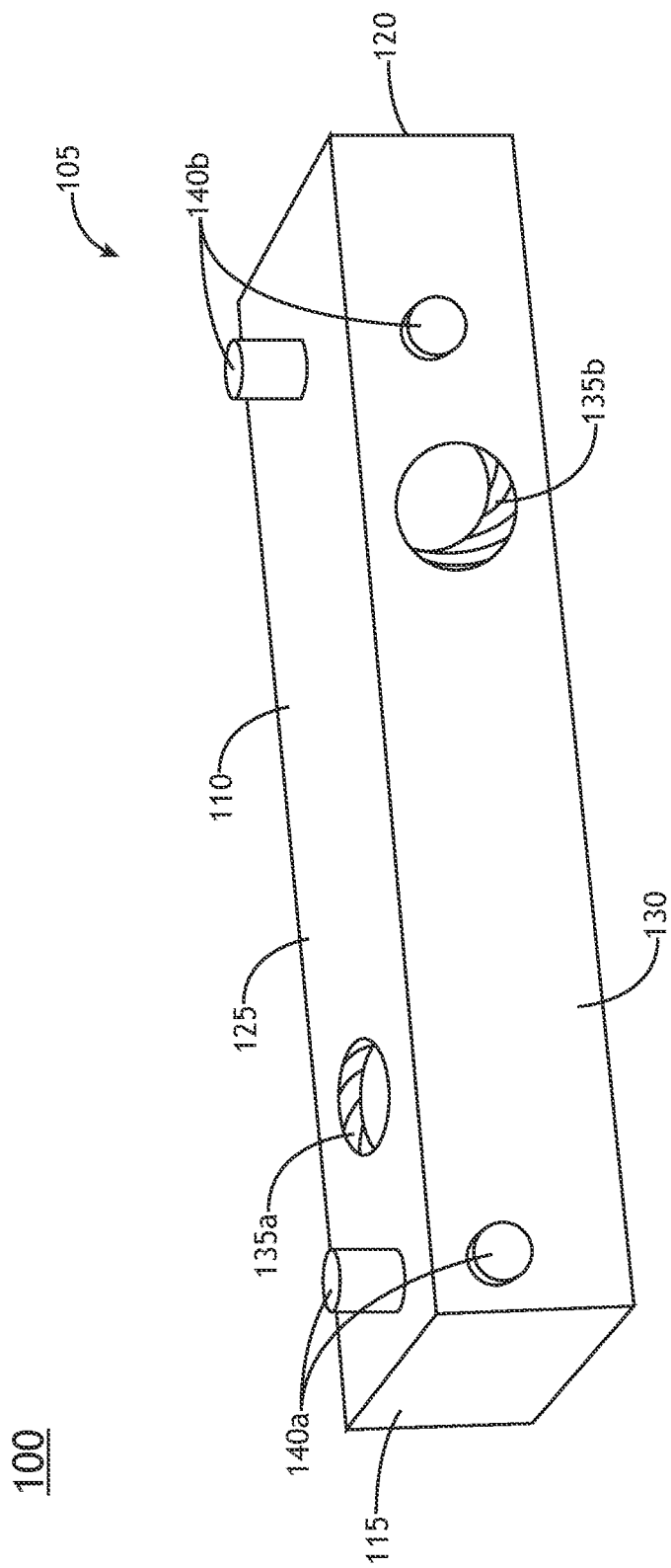
FIG. 1A is a diagram illustrating a perspective view of a structural connector system, in accordance with one or more embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of sub-combination of two or more such features, along with any other features which may not necessarily be expressly described or inherently present in the instant disclosure.

A structural connector system for providing an electrical connection between electronic componentry is disclosed. The structural connector system may be configured as a component of a structural chassis for an electronic device that provides a protective construction for the electronic componentry within the device and an anchor point for the electronic components as well as providing electrical connectivity between two or more electronic components within or associated with the electronic device. The structural chassis may comprise a single structural connector system, more than one structural connector system, or may be constructed entirely of structural connector systems. The mechanical and electrical coupling of electronic components by the structural connector system increases the packing density of components (e.g., less need for wires). The structural connector system also eases and or simplifies the mechanical assembly of electronic components, leading to decreased cost, decreased weight, and/or decreased weight for device assembly and/or use.

FIG. 1A illustrates a structural connector system 100, in accordance with one or more embodiments of the disclosure.

In some embodiments, the structural connector system includes a first structural member 105. The first structural member 105 may be of any shape known in the art for constructing electronic devices. For example, the first structural member 105 may have a cuboid shape. For instance, the first structural member 105 may be configured as a right rectangular prism (e.g., as indicated in FIG. 1A). In another example, the first structural member 105 may be configured as a hexagonal prism. In another example, the first structural member 105 may be configured as a triangular prism. In another example, the first structural member may be configured as an octagonal prism. In another example, the first structural member may be configured as a half or quarter cylinder (e.g., having one or more straight length sides and one curved length side). In another example, the first structural member may be configured as a shape having one or more rounded corners (e.g., the corner at the intersection between two planes of the shape). In another example, the first structural member 105 may be shaped with grooves or slits that allow interlocking with other first structural members 105.

The first structural member 105 may be of any size. For example, the first structural member 105 may have a length, height and/or width corresponding to the size requirements of a line replaceable unit (LRU). For instance, the length of the first structural member 105 may be approximately 19.3 cm (i.e., approximately the standard height dimension for an ARINC-600 standardized LRU). In another instance, the length of the first structural member 105 may be approximately 31.8 cm (e.g., approximately the standard length for an LRU. In another example, the first structural member 105 may have a length, height, or width corresponding to the size of a multi-chip module (e.g., the first structural member 105 providing mechanical support and electrical coupling to one or more integrated circuit packages). For instance, the first structural member may have a length ranging from one cm to 10 cm.

In some embodiments, the first structural member 105 includes an insulating matrix 110. The insulating matrix 110 is configured to electrically insulate one or more areas of the first structural member 105 from any electrical routes that are provided on or under the surface of the first structural member 105. The insulating matrix 110 may include any type of electrically insulating material including but not limited to plastics, ceramics, glass, polymers, rubber. The first structural member 105 may also include any non-electrically insulating material (e.g., metal) that is itself electrically insulated from any electrical routes.

In some embodiments, the first structural member 105 includes a first end surface 115, a second end surface 120 (i.e., the top and bottom faces), and a first component engaging surface 125. The first component engaging surface 125 may be any surface of the first structural member 105 (e.g., one of the sides of the first structural member 105, the first end surface 115, or the second end surface 120). For example, the first component engaging surface 125 may be configured adjacent to at least one of the first end surface 115 or the second end surface 120. The first component engaging surface 125 is configured to mechanically couple and/or electrically couple to a first electronic component of an electronic device and/or a first chassis component. The first component may be any type of componentry used for an electronic device including but not limited to printed circuit boards (PCB), printed wiring boards (PWB), expansion cards, electronic packages, motherboards, backplanes, riser cards, expansion slots, connector sockets, and batteries. The first chassis component may include any structural element including but not limited to a chassis frame section, a backplane, an air transport rack ATR) section, or a another first structural member 105).

In some embodiments, the first structural member 105 includes at least one second component engaging surface 130. The second component engaging surface 130 may be any surface of the first structural member 105 (e.g., one of the sides of the first structural member 105, the first end surface 115, or the second end surface 120). For example, the second component engaging surface 130 may be configured adjacent to at least one of the first end surface 115 or the second end surface 120. The second component engaging surface 130 is configured to mechanically couple and electrically couple to a second component of an electronic device. The second component may be any type of componentry used for an electronic device including but not limited to printed circuit boards (PCB), printed wiring boards (PWB), expansion cards, electronic packages, motherboards, backplanes, riser cards, expansion slots, connector sockets, and batteries. The first component and the second component may comprise the same component. For example, an expansion card may be configured to mechanically couple and electrically couple to the first component engaging surface 125 and mechanically couple and/or electrically couple to the second component engaging surface 130 (i.e., mechanically coupling a component to more than one surface may increase stability of the component.

The second component engaging surface 130 may be disposed on a side of the first structural member 105 adjacent to the first component engaging surface 125 (e.g., as shown in FIG. 1A). In some embodiments, the second component engaging surface may be disposed on a side of the first structural member 105 nonadjacent to the first component engaging surface 125. (e.g., the opposite side of the first component engaging surface 125). Therefore, any side of the first structural member 105 and any number of sides of the first structural member 105 may be configured as a second component engaging surface 130. For example, the first end surface 115 and/or the second end surface may be configured as a second component engaging surface 130.

In embodiments, the first component engaging surface 125 and the second component engaging surface 130 include one or more mechanical couplers 135a, 135b (e.g., one or more first mechanical couplers for the first component engaging surface 125 and one or more second mechanical couplers for the second component engaging surface 130). The mechanical couplers 135a, 135b are configured to couple the first structural member 105 to the first component of the electronic device, the second component of the electronic device, a first chassis component, or a second chassis component (e.g., the first chassis component or second chassis component may be configured as a second structural member).

The mechanical couplers 135a, 135b may be configured as any type of coupling device or fastener that includes but are not limited to clamps, locks (e.g., friction locks), coupling nuts, rivets (e.g., Christmas tree rivets), and screws. For example, the mechanical coupler 135a, 135b may comprise a threaded bore on the first structural member 105 configured to receive a threaded screw. Once received, threaded screw is then configured to enter through to the opposite side of the first structural member 105, toward the first component of the device configured with a similarly threaded bore. Further insertion of threaded screw engaged the threaded bore on the first component, mechanically coupling the first component to the first structural member 105. Thus, the mechanical couplers 135a, 135b may be configured to mechanically attach an electronic component to a side of the first structural member 105 that faces inside an electronic chassis while accessing the side of the first structural member 105 that faces the outside of the electronic chassis. In another example, the mechanical couplers 135a,135b may include clearance holes. The clearance holes may be configured as oversized holes that allow the fasteners to move slightly to account for tolerance stackup. The clearance holes may also enable easy access of a screwdriver to engage and tighten the threaded screw, further tightening the first component to the first structural member 105.

In embodiments, the first component engaging surface 125 and the second component engaging surface 130 include one or more electrical couplers 140a, 140b configured to electrically couple with one or more electronic components (e.g., a first electronic component and/or a second electronic component) or with one or more chassis components (e.g., a first chassis component and/or a second chassis component). The one or more electrical couplers 140a, 140b may couple an electronic component in tandem with the mechanical coupling of the same electronic component via the one or more mechanical couplers 135a, 135b. For example, as a first electronic component is tightened against the first structural member 105 via one of the one or more mechanical couplers 135a, the electrical coupler 140a may come into contact with an electrical contact of the first electronic component. The one or more mechanical couplers 135a, 135b, may also mechanically couple to a first electronic component without electrically coupling (e.g., the one or more electric couplers 140a,140b are not used for purely mechanical couplings). In another example, the one or more electrical couplers 140a, 140b, may also both electrically couple and mechanically couple the first structural member 105 to the first electronic component. For example, the electrical coupler may be configured as a metallic screw configured to be received by a threaded borehole disposed within the first structural member 105 and configured to be received by a metallic threaded receiver on the first electronic component, wherein tightening of the screw secures the first electronic component to the first structural member 105 and provides a conductive path from the first structural member to the electronic component. In other words, the mechanical coupler 135a, 135b, such as a fastener, may be integrated into an electrical circuit. Alternatively, the fastener may be electrically isolated from the electrical circuit. It should be understood that electrical coupling may include either the contact of two or more electrically conducting elements or the contact and mechanical coupling of two or more electrically conducting elements.

In embodiments, the first structural member 105 further includes a third electrical coupler configured to electrically couple the first electronic component, the first chassis component, the second electronic component, the second chassis component, a third electronic component, or a third chassis component to a third end of the electrically conducting path 155 (i.e., the electrically conducting path 155 configured as a branched path, having multiple ends). For example, the third electrical coupler may be disposed on a third component engaging surface. For instance, the third electrical coupler may be disposed on a third component engaging surface along with a third mechanical coupler. In this manner, the first structural member 105 may have any number of component engaging surfaces, electrical couplers 140, mechanical couplers 135, and electrically conducting paths 155, with any number of the electrically conducing paths 155 branched with any number of ends. Therefore, the above description should not be interpreted as a limitation of the present disclosure, but as an illustration.

Figure 1B:
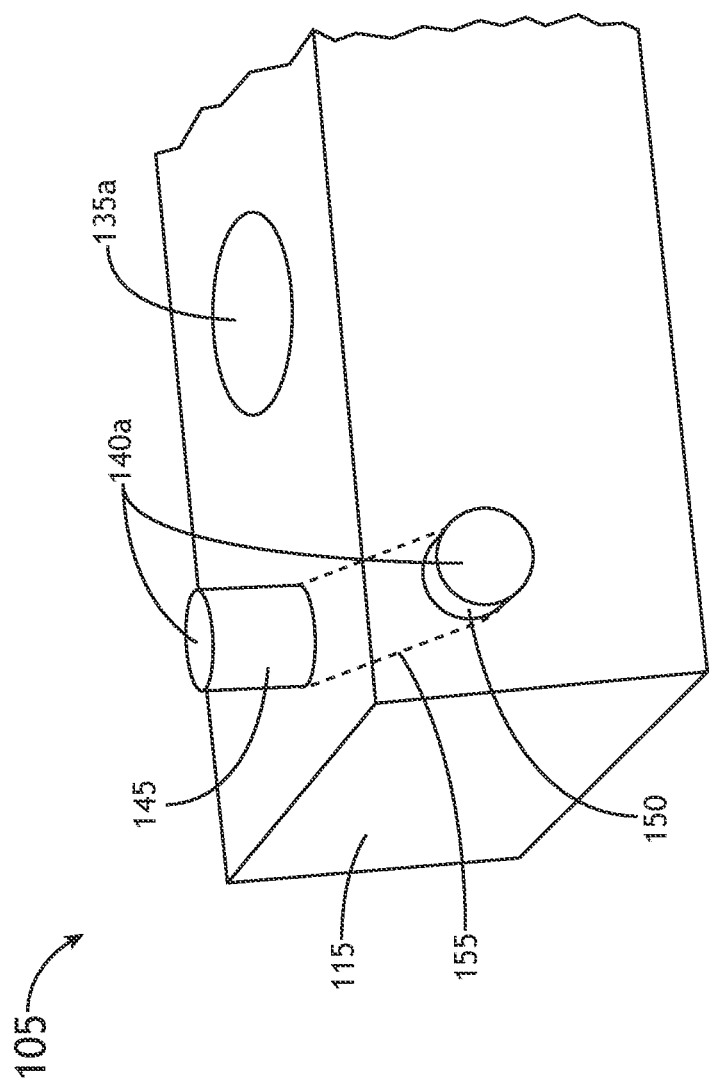
FIG. 1B is a diagram illustrating a close-up perspective view of a structural connector system, in accordance with one or more embodiments of this disclosure.

FIG. 1B illustrates a close-up view of the structural connector system 100 as shown in FIG. 1A, in accordance with one or more embodiments of the disclosure. The close-up view demonstrates a first conducting element 145 and a second conducting element 150 of the electrical coupler 140a, which are electrically coupled via an electrically conducting path 155 (i.e., the electrically conducting path 155, the first conducting element, and the second conducting element comprise the electric coupler 140a, permitting the electric coupler 140a to receive and transmit an electric impulses). For example, the first conducting element 145 may receive electric impulses from a first electronic component and transmit the impulses to a second electronic component via the second conducting element 150. In another example, the first conducting element 145 and the second conducting element 150 are configured as a combined conducting element that is embedded within the electrically insulating matrix 110 (e.g., along the electrically conducting path 155).

The electrically conducting path 155 may be formed of the same or different material as the first conducting element and the second conducting element. For example, the electrical coupler 140a, including the electrically conducting path, the first conducting element, and the second conducting element, may be configured as a copper wire than has been inserted into a borehole within the first structural element. The electrical coupler 140a may also be formed of other compressible electrical contacts such as fuzz buttons or pogo pins. The electrical coupler 140a may configured preinstalled within the first structural member 105, or may require installment into the first structural member 105. For example, the first structural member 105 may have a shaft 155 predrilled through the first component engaging surface 125 and the second component engaging surface 130, forming a first aperture and a second aperture that permits the introduction of the electrically conducting path 155 (e.g., a fuzz button) into the shaft 155.

Any orientation and/or placement of the first conducting element 145 and the second conducting element 150 are possible. For example, the first conducting element 145 may be configured as protruding the first component engaging surface 125, with the second conducting element 145 protruding the second component engaging surface 130 (e.g., an adjacent side), the first conducting element 145 and the second conducting element electrically coupled via the electrically conducting path 155 (e.g., the electrically coupled path disposed with the first structural member 105, as in FIG. 1B. In another example, the first conducting element 145 and the second conducting element 150 may be disposed on the same side of the first structural member 105. In another example, the first conducting element 145 and the second conducting element 150 may be disposed on non-adjacent sides of the first structural member 105 (e.g., opposite sides). In another example, the first conducting element 145 may be disposed on the first component engaging surface 125 while the second conducting element may be disposed on an adjacent first end surface 115. Thus, the electronic coupler 140 provides an electrically conducting path between two adjacent or nonadjacent faces of the first structural member 105, with the electrical coupler providing a first conducting element 145 and a second conducting element 150 providing an electrical contact for one or more electronic components.

It should be understood that an electric coupler 140 (e.g., a first electric coupler) having a first conducting element 145 disposed on the first component engaging surface 125 and a second conducting element 150 disposed on the second component engaging surface 130 may also be considered as an electric coupler 140 (e.g., a second electric coupler) having a first conducting element 145 dispose on the second component engaging surface 130 and a second conducting element 150 dispose on the first component engaging surface 125 (i.e., both the first component engaging surface 125 and the second engaging surface 130 'claiming' the same electric coupler). Therefore, the above description should not be interpreted as a limitation of the present disclosure, but as an illustration.

Figure 1C:
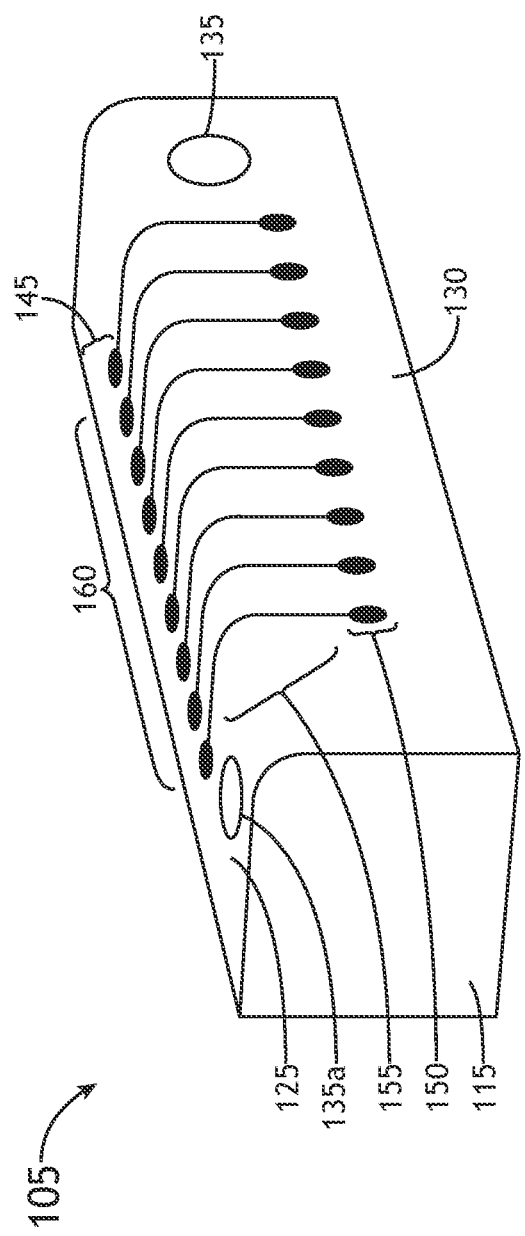
FIG. 1C is a diagram illustrating a first structural member with several electrical couplers, in accordance with one or more embodiments of this disclosure.

In embodiments, the electrically conducting path 155 may be disposed on the one or more surfaces of the first structural member 105. FIG. 1C illustrates a first structural member 105 with several electrical couplers 140, each having an externally laid electrically conductive path 155 that connect first conducting elements 145 with second conducting elements 150. For example, the electrically conductive path 155 may be configured as one or more traces 160 deposited on the first component engaging surface 125, the second component engaging surface 130, and/or other surfaces on the first structural member 105 (e.g., the one or more traces 160 disposed on the external surface of the first structural member). The first conducting elements 145 and second conducting elements 150 may be deposited along with the electrically conductive path, or may be configured as compliant connectors that are linked to the one or more traces 160.

In embodiments, one or more surfaces of the first structural member 105 may be curved to facilitate the process of connecting the first conductive elements 145 and second conductive elements 150. For example, the curved surfaces may reduce stress concentrations that may occur at corners. The electrically conductive path 155 may be deposited onto one or more surfaces of the first structural member via any method known including but not limited to vapor deposition, plating processes, or printing. The first conductive element 145 and the second conductive element 150 also may be formed via any method known including but not limited to vapor deposition, plating processes, or printing.

Figure 1D:
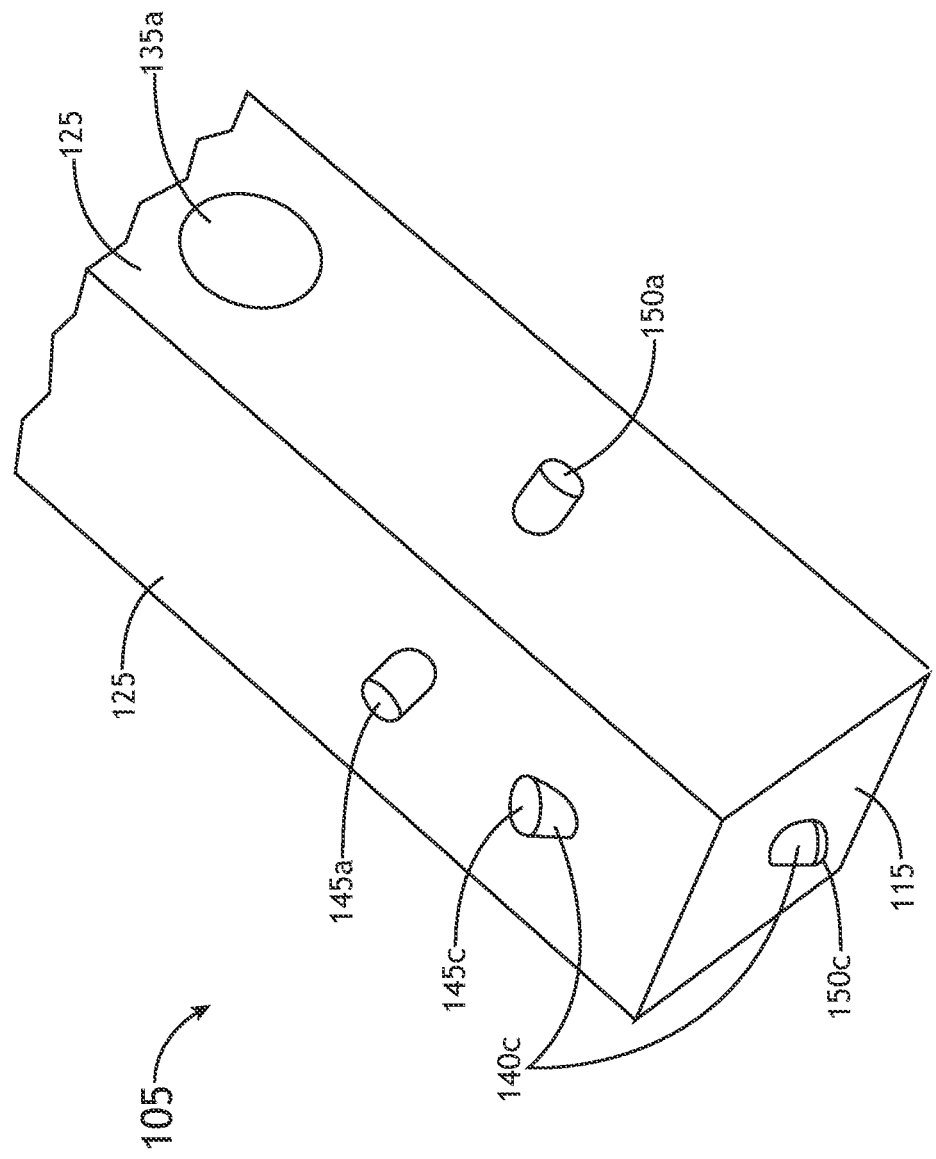
FIG. 1D is a diagram illustrating a close-up perspective view of a structural connector system, in accordance with one or more embodiments of this disclosure.

The first conductive element and second conductive element may be oriented so as to increase the contact of the electrical coupler 140 with the electronic component. FIG. 1D illustrates a section of the first structural member 105 configured with electrical couplers 140a, 140c having first conducting elements 145a, 145c, and second conducting elements 150a, 150c that are angled relative to the face of the side that the elements project. For example, the first conducting element 145a projects outward from the first component engaging surface 125 at approximately 45° relative to the plane of the first component engaging surface 125. The corresponding second conducting element 150a projects outward from the second component engaging surface 130 at approximately 45° relative to the plane of the second component engaging surface. In another example, the first conducting element 145c projects outward from the first component engaging surface 125 at approximately 45° relative to the plane of the first component engaging surface 125. The corresponding second conducting element 150c projects outward from the first end surface 115, at approximately 45° relative to the plane of the second component engaging surface. Any angle or orientation of the first conducting element 145 or second conducting element 150 are possible.

It should be understood that the first conducting element 145 and the second conducting element 150 may be combined as a single component that is threaded through insulating matrix 110 of the first structural member 105 (e.g., via the electrically conducting path 155). It should also be understood that the first conducting element 145 and the second conducting elements 150 may be configured as separate elements inserted into the holes within the insulating matrix 110. Any configuration of first conducting elements 145 and second conducting elements are possible. Therefore, the above description should not be interpreted as a limitation of the present disclosure, but as an illustration.

Figure 2A:
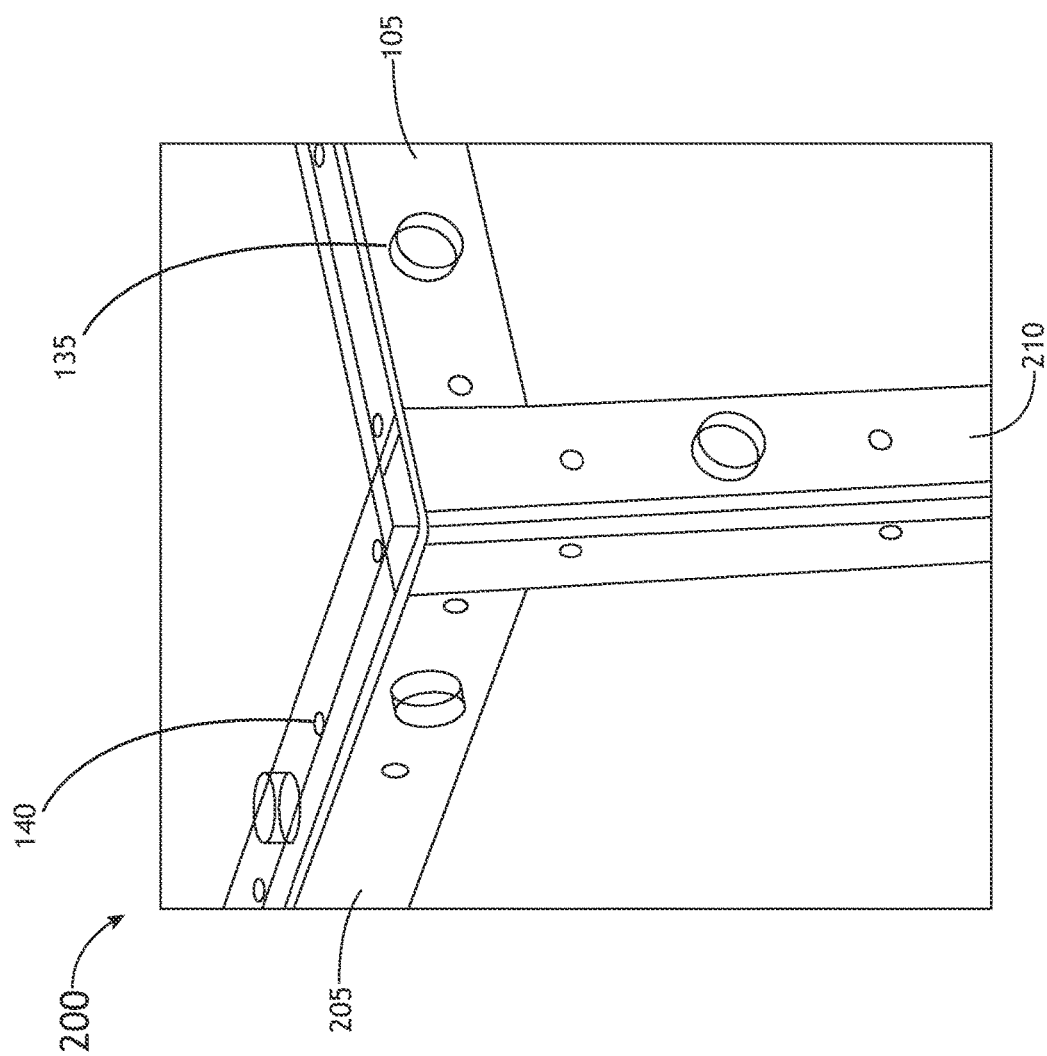
FIG. 2A illustrates a portion of a chassis framework that includes the first structural member with a second structural member and a third structural member, in accordance with one or more embodiments of the disclosure.

In embodiments, the first structural member 105 may attach to other members within a chassis. FIG. 2A illustrates a portion of a chassis framework 200 that includes the first structural member 105 with a second structural member 205 and a third structural member 210, in accordance with one or more embodiments of the disclosure. An end of each of the first structural member 105, the second structural member 205, and the third structural member 210 are mechanically coupled via the mechanical coupler 135 or other coupling mechanism to form a corner. Various mechanical couplers 135 and electrical couplers 140 located along the first structural member 105, the second structural member 205, and the third structural member 210 may be configured to mechanically couple and/or electrically couple to multiple electronic components and/or chassis components (i.e., similar to the first structural member). Electrical couplers 140 disposed on the first end surface 115 of the first structural member and/or the second structural member 205, along with an electrical coupler 140 on the third structural member may also be electrically coupled, allowing current to be conducted through multiple structural members. In some embodiments, at least one of the first mechanical coupler 135a or the second mechanical coupler 135b is electrically coupled to the electrically conductive path 155 and at least one of the first electronic component or the second electronic component."

Figure 2B:
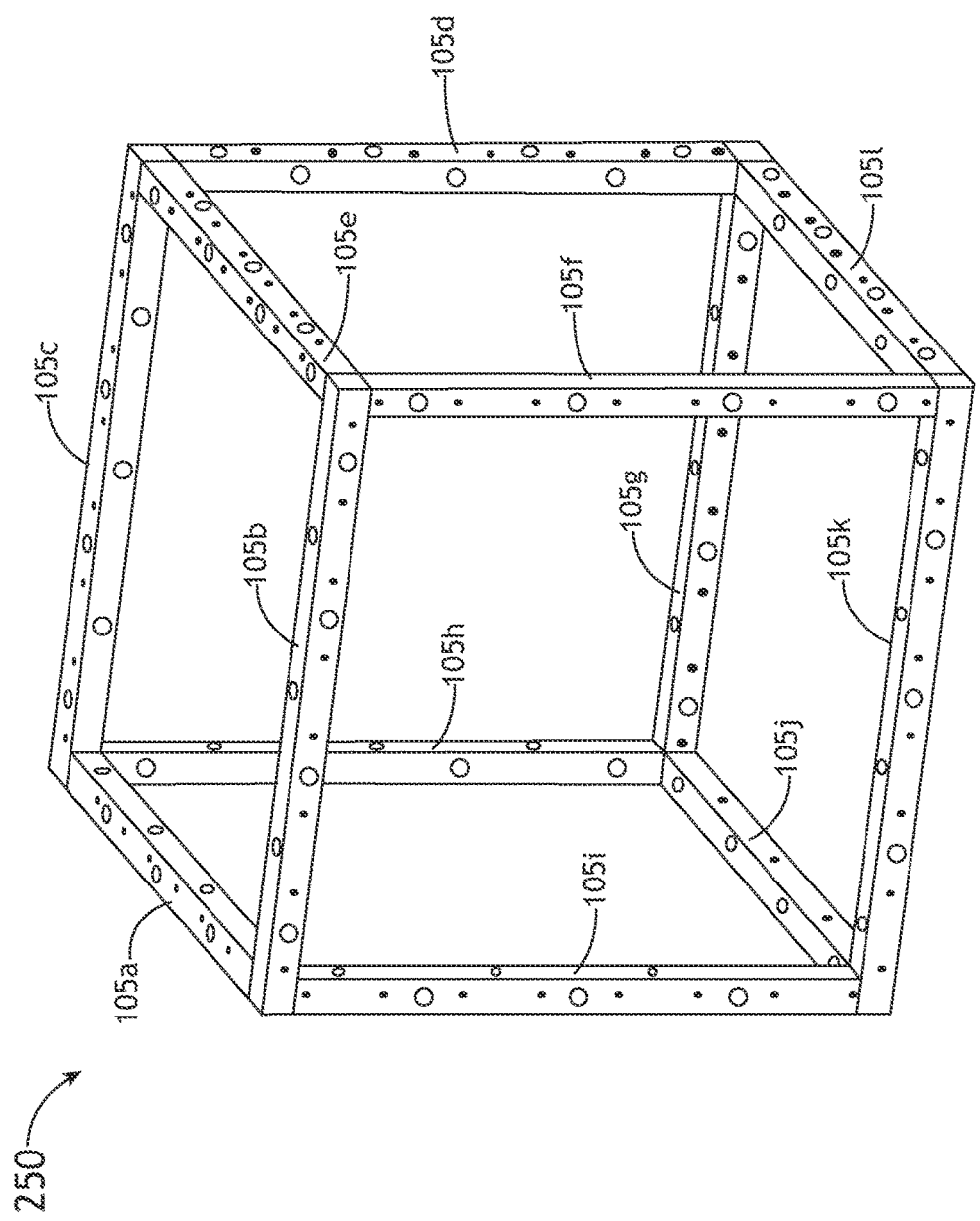
FIG. 2B illustrates an electronic chassis formed from 12 first structural members, in accordance with one or more embodiments of the disclosure.

FIG. 2B illustrates an electronic chassis 250 formed from 12 first structural members 105a-l, in accordance with one or more embodiments of the disclosure. Mechanical couplers 135 and electrical couplers 140 distributed along the first structural members 105a-l may be used to mechanically couple and electrically couple electronic components to the electronic chassis 250. The electronic chassis 250 may be of any type of structure and should not be limited to the cube shape as shown in FIG. 2B. For example, the electronic chassis 250 may be formed as a rectangular prism (e.g., with dimensions associated with LRUs). In another example, the electronic chassis 250 may be configured as an icosahedron. The electronic chassis 250 may also be configured as a module for an electronic chassis system, wherein multiple electronic chassis 250 are coupled together via one of more mechanical couplers 135 and are electrically coupled via one or more electrical couplers 140. It is inferred first structural members 105a-l act as part of the circuitry within the electronic chassis 250 and electronic components. Removal of one or more of the first structural members 105a-l may interrupt an electrical circuit within the electronic components, causing the electronic components to cease function.

In some embodiments, the electrical coupler 140 may include any passive electronic element including but not limited to resistors, capacitors, and inductors. For example, the electrically conductive path 155 of the electric coupler 140 may include a resistor configured to limit current flow. In another example, the first conducting element 145 may include a capacitor configured to store electric charge as well as a conducting surface configured to electrically couple to an electronic component.

In some embodiments, the electrical coupler 140 may include active electronic elements including but not limited to transistor, diodes, visible status annunciators, line drivers, and integrated circuits. For example, the electric coupler 140 may include a status annunciator configured to emit a light signal upon the detection of current. In another example, the electrically conductive path 155 of the electric coupler 140 may include a diode configured to control current flow through the electrically conductive path 155.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. A structural connector system for providing an electrical connection between electronic componentry comprising:
    a first structural member comprising:
        an electrically insulating matrix;
        an electrically conducting path;
        a first end surface;
        a second end surface;
        a first component engaging surface comprising:
            a first mechanical coupler configured to mechanically couple a first electronic component or a first chassis component to the structural member;
            a first electrical coupler configured to electrically couple the first electronic component or the first chassis component to a first end of the electrically conducting path;
        a second component engaging surface comprising:
            a second mechanical coupler configured to mechanically couple the first electronic component, the first chassis component, a second electronic component, or a second chassis component to the first structural member;
            a second electrical coupler configured to electrically couple the first electronic component, the first chassis component, the second electronic component, or the second chassis component to a second end of the electrically conducting path,
        wherein at least one of the first mechanical coupler or the second mechanical coupler is electrically coupled to the electrically conductive path and at least one of the first electronic component or the second electronic component,
        wherein the first component engaging surface and the second component engaging surface are adjacent,
        wherein the first electrical coupler comprises a first conducting element projecting outward from the first component engaging surface at approximately 45° relative to the first component engaging surface,
        wherein the first mechanical coupler comprises a threaded bore,
        wherein the first conducting element of the first electrical coupler and a second conducting element of the second electrical coupler are a single component that is threaded through the first structural member.

2. The structural connector system of claim 1, at least one of the first chassis component or the second chassis component is configured as a second structural member.

3. The structural connector system of claim 1, wherein at least one of the first end surface or the second end surface is configured as the second component engaging surface.

4. The structural connector system of claim 1, wherein at least one of the first mechanical coupler or the second mechanical coupler comprises a fastener.

5. The structural connector system of claim 1, wherein the electrically conductive path is disposed within the electrically insulating matrix.

6. The structural connector system of claim 1, wherein at least one of the first chassis component or the second chassis component is a second structural member.

7. A structural connector system for providing an electrical connection between electronic componentry comprising:
    a first structural member comprising:
        an electrically insulating matrix;
        an electrically conductive path;
        a first end surface;
        a second end surface;
        a first component engaging surface comprising:
            a first mechanical coupler configured to mechanically couple a first electronic component or a first chassis component to the structural member;
            a first electrical coupler configured to electrically couple the first electronic component or the first chassis component to the electrically conductive path;
        a second component engaging surface comprising:
            a second mechanical coupler configured to mechanically couple the first electronic component, the first chassis component, a second electronic component, or a second chassis component to the first structural member;
            a second electrical coupler configured to electrically couple the first electronic component, the first chassis component, the second electronic component, or the second chassis component to the electrically conductive path,
        wherein at least one of the first mechanical coupler or the second mechanical coupler is electrically coupled to the electrically conductive path and at least one of the first electronic component or the second electronic component,
        wherein the first component engaging surface and the second component engaging surface are adjacent,
        wherein the first electrical coupler comprises a first conducting element projecting outward from the first component engaging surface at approximately 45° relative to the first component engaging surface,
        wherein the first mechanical coupler comprises a threaded bore,
        wherein a first conducting element of the first electrical coupler and a second conducting element of the second electrical coupler are a single component that is threaded through the first structural member.

\* \* \* \* \*